United States Patent [19]

Hill

[11] Patent Number: 5,168,510

[45] Date of Patent: Dec. 1, 1992

[54] SPREAD SPECTRUM-TIME DIVERSITY COMMUNICATIONS SYSTEMS AND TRANSCEIVERS FOR MULTIDROP AREA NETWORKS

[75] Inventor: Lawrence W. Hill, Arlington, Mass.

[73] Assignee: ComSource Systems, Hollis, N.H.

[21] Appl. No.: 333,336

[22] Filed: Apr. 5, 1989

Related U.S. Application Data

[60] Continuation-in-part of Ser. No. 309,272, Feb. 10, 1989, which is a continuation-in-part of Ser. No. 115,245, Oct. 30, 1987, which is a continuation-in-part of Ser. No. 846,924, Apr. 1, 1986, abandoned, which is a division of Ser. No. 586,863, Mar. 6, 1984, Pat. No. 4,597,082.

[51] Int. Cl.$^5$ .......................... H04B 7/02; H04L 1/02
[52] U.S. Cl. ........................................ 375/40; 371/70; 370/21
[58] Field of Search ............. 375/39, 40, 100; 455/132, 133, 135; 371/8.1, 68.1, 70; 340/825.01, 825.03; 370/18, 21

[56] References Cited

U.S. PATENT DOCUMENTS

| | | | |
|---|---|---|---|
| 3,160,711 | 12/1964 | Schroeder | 370/18 |
| 3,199,077 | 8/1965 | Prather | 371/70 |
| 3,214,691 | 10/1965 | Sproul et al. | 370/18 |
| 3,631,232 | 12/1971 | Perrzault | 375/11 |
| 3,751,596 | 8/1973 | Tseng | 370/18 |
| 3,783,385 | 1/1974 | Dunn et al. | 375/40 |
| 3,963,988 | 6/1976 | Niethammer | 375/40 |
| 4,063,174 | 12/1977 | Gupta et al. | 375/40 |
| 4,099,121 | 7/1978 | Fang | 375/40 |
| 4,186,347 | 1/1986 | Brockman et al. | 375/100 |
| 4,320,526 | 3/1980 | Gitlin | 375/14 |
| 4,460,992 | 7/1984 | Gutlebzer | 370/19 |
| 4,494,238 | 1/1985 | Groth, Jr. | 375/40 |
| 4,628,517 | 12/1986 | Schwarz et al. | 375/40 |
| 4,641,318 | 2/1987 | Addeo | 375/40 |

Primary Examiner—Stephen Chin
Attorney, Agent, or Firm—F. Eugene Davis, IV

[57] ABSTRACT

Messages are transmitted on pairs of frequencies that are orthogonal, that is the frequencies have no least common denominator (are prime to each other). A message is transmitted on the first of the pair of frequencies and, simultaneously, its complement is transmitted on the second of said pair of frequencies. The message is then retransmitted on another pair of orthogonal frequencies. In the second transmission, the message is remapped, such that, adjacent bits in the first transmission are not adjacent in the second transmission and the same bit in the first transmission and the second transmission are not spaced 1/120th of a second apart. Information is collected on the data error rates at each receiver. This information is periodically transmitted to a central frequency controller which collects this error information and determines the error rates on the frequencies being used. A hill-climbing technique is used to choose pairs of frequencies having the lowest current data error rates. The frequency controller transmits the identity of these frequencies to the various transceivers in each message. The transceivers comprise a frequency controlled carrier frequency generator, appropriate data keying for the carrier, a pair of digital state machines, each having a frequency controlled filter connected thereto, appropriate microprocessors for control and broad band coupling networks for coupling the transceiver to a communications channel, which may be an AC power line, a private line, the floor loop of an automatic guided vehicle system, or the like.

11 Claims, 6 Drawing Sheets

SPREAD SPECTRUM-TIME DIVERSITY COMMUNICATIONS SYSTEMS AND TRANSCEIVERS FOR MULTIDROP AREA NETWORKS

RELATED APPLICATIONS

This application is a Continuation-in-Part of U.S.-nited application Ser. No. 07/309,272, filed Feb. 10, 1989, which application was a Continuation-in-Part of U.S. application Ser. No. 07/115,245, filed Oct. 30, 1987, which application was a Continuation-in-Part of application Ser. No. 06/846,924 of Apr. 1, 1986, now abandoned, which application was a Divisional Application of U.S. application Ser. No. 06/586,863 of Mar. 6, 1984, now U.S. Pat. No. 4,597,082, issued Jun. 24, 1986; the above applications and patent are incorporated herein by reference.

TECHNICAL FIELD

This invention relates to spread spectrum-time diversity communications systems and transceivers for multidrop local area networks. Such transceivers may be used for communication over power lines, twisted pairs, over wires lain along the path of guided vehicles, or the like. The invention further relates to the transmission of digital data in industrial environments over transmission channels having noise characteristics influenced by the industrial environment.

BACKGROUND ART

In the above-identified U.S. Pat. No. 4,597,082, there is disclosed a transceiver for multidrop local area networks for transmission over AC transmission lines, private wire, or other less noisy transmission channels that provides error free transmissions at very high data rates in noisy industrial environments at low cost.

In the above-identified application, Ser. No. 07/115,245, there is disclosed a transceiver system for communication over wire laid along the path of guided vehicles, where in the transmission channel, is the typical floor loop used to guide such vehicles. In Ser. No. 07/309,272, filed Feb. 10, 1989, entitled Transmission Line Termination of Guide-Communications Wire For Guided Vehicles, the problem of null positions in such floor loops, at which the strength of signals sent from the host modem, is so low or non-existent that communications is impossible with the guided vehicle and one solution to that problem are discussed.

The present invention is directed to eliminating such multipath problems in wire guided vehicle applications and to combating periodic impulse and slowly time varying continuous wave noise typical of wire guided vehicles, power line carrier transmission systems and other transmission channels in an industrial environment.

While, according to the prior art, spread spectrum (frequency hopping) systems and time diversity techniques have been utilized to overcome transmission problems caused by random noise, which may be natural or caused by jamming, such techniques have not been utilized in low cost systems, which are oriented towards adaptive avoidance of inadvertent man-made noise, such as in the industrial environment. Such noise is time varying, but not truly random.

DISCLOSURE OF THE INVENTION

The transceivers of the present invention use adaptive frequency hopping to eliminate the effects of multipath and standing waves in floor loops and to avoid time varying continuous wave noise. The transceivers also utilize time diversity and strong error correction coding. The time diversity is particularly adapted to combat 120 hertz impulse noise found in industrial environoments.

The transceivers utilize the digital reconstruction filter state machine detection disclosed in the above-identified patent.

In one embodiment of the invention, 16 frequencies are utilized in a frequency band from approximately 100 kiloHertz to 400 kiloHertz. These frequencies are chosen, such that the side bands of sets of four of the frequencies, do not overlap, and such that, at least pairs (and preferably sets of four) frequencies have no least common denominator (i.e. are prime to each other). Such frequencies are herein referred to as orthogonal.

According to the invention, messages are sent in blocks of 21 bytes of eight bits each comprising a sync byte, an address byte, a protocol byte, a frequency selection byte, 15 data bytes, and two bytes of error correction code.

A data block is transmitted on a first frequency and simultaneously its complement is transmitted on a different frequency. That is, on the first frequency, presence of carrier is a one and lack of carrier is a zero, while on the second frequency, the presence of carrier is a zero and lack of carrier is a one or vice versa. At the end of transmission of a block on the first pair of frequencies, the block is retransmitted on a second pair of frequencies after remapping of the bits of the block into a different sequence, such that no two bits, which are adjacent in the first transmission are adjacent in the second transmission and the same bit is never present in the second block, 8.33 milliseconds after its presence in the first block, since this is the repetition rate of 120 hertz impulse noise.

In one embodiment of the invention, the transmission rate is 30 kilobits per second and each data block, consisting of 168 bits, takes 5.6 milliseconds for transmission. This provides an information rate of 15 bytes in 11.2 milliseconds, that is 10,714 bits per second, which is equivalent to a 14,667 bits per second asynchronous rate.

The transceiver according to the invention is, therefore, provided with a protocol program and a I/O program, which may operate on separate computers or through time sharing on a single computer. In the transmit mode, the I/O program transmits a frequency code to a digital counter which changes its counting modulus so as to produce the correct frequency for transmission, which is then gated and wave shaped under control of data supplied by the physical I/O program.

During reception, a pair of digital state machines are provided, each for receiving one of the two simultaneous frequencies being received, the I/O program provides a frequency code to a frequency controlled filter, which passes the appropriate frequency to the digital state machine, which utilizing the clock signal and a frequency code, sets itself to receive the transmitted frequency.

The frequency controlled filter may comprise an operational amplifier, having a frequency controlled feedback loop. If 16 frequencies are employed, one of 16

RC constants are chosen by the frequency code through selection of resistance or capacitance in the feedback loop.

According to the invention, detection of an uncorrectable error after the spread spectrum-time diversity transmission of a data block will cause the receiver to transmit an error message to the sending transceiver, which will retransmit the data block.

Means are provided for initializing the system so that all transceivers are operating on the same two sets of frequency pairs.

The choice of frequencies is adjusted based upon knowledge of cumulated data about error rates on each frequency. Frequencies are chosen using a hill-climbing technique so that communications converge to areas of the spectrum having the most favorable signal to noise ratios.

OBJECTS OF THE INVENTION

It is therefore an object of the invention to provide improved communications in an environment of slowly time varying continuous wave noise and constant frequency impulse noise.

Another object of the invention, is to provide such communications utilizing spread spectrum and time diversity techniques.

A further object of the invention, is to provide for such communications in industrial environments over power lines, dedicated pairs, automated guided vehicle floor loops, and similar noisy transmission channels.

Another object of the invention, is to increase the data rates in such communications.

A still further object of the invention, is to reduce error rates in such communications.

Other objects of the invention, will in part be obvious and will in part appear hereinafter.

The invention accordingly comprises the features of construction, several elements, the arrangements of parts, and the choice of functions and signals, which will be exemplified in the construction of the systems hereinafter set forth. The scope of the invention is indicated in the claims.

BRIEF DESCRIPTION OF THE DRAWINGS

For a fuller understanding of the nature and objects of the invention, reference should be had to the following detailed description, taken in connection with the accompanying drawings, in which.

The same reference characters refer to the same elements throughout the several views of the drawings.

BEST MODE FOR CARRYING OUT THE INVENTION

Figure 1:
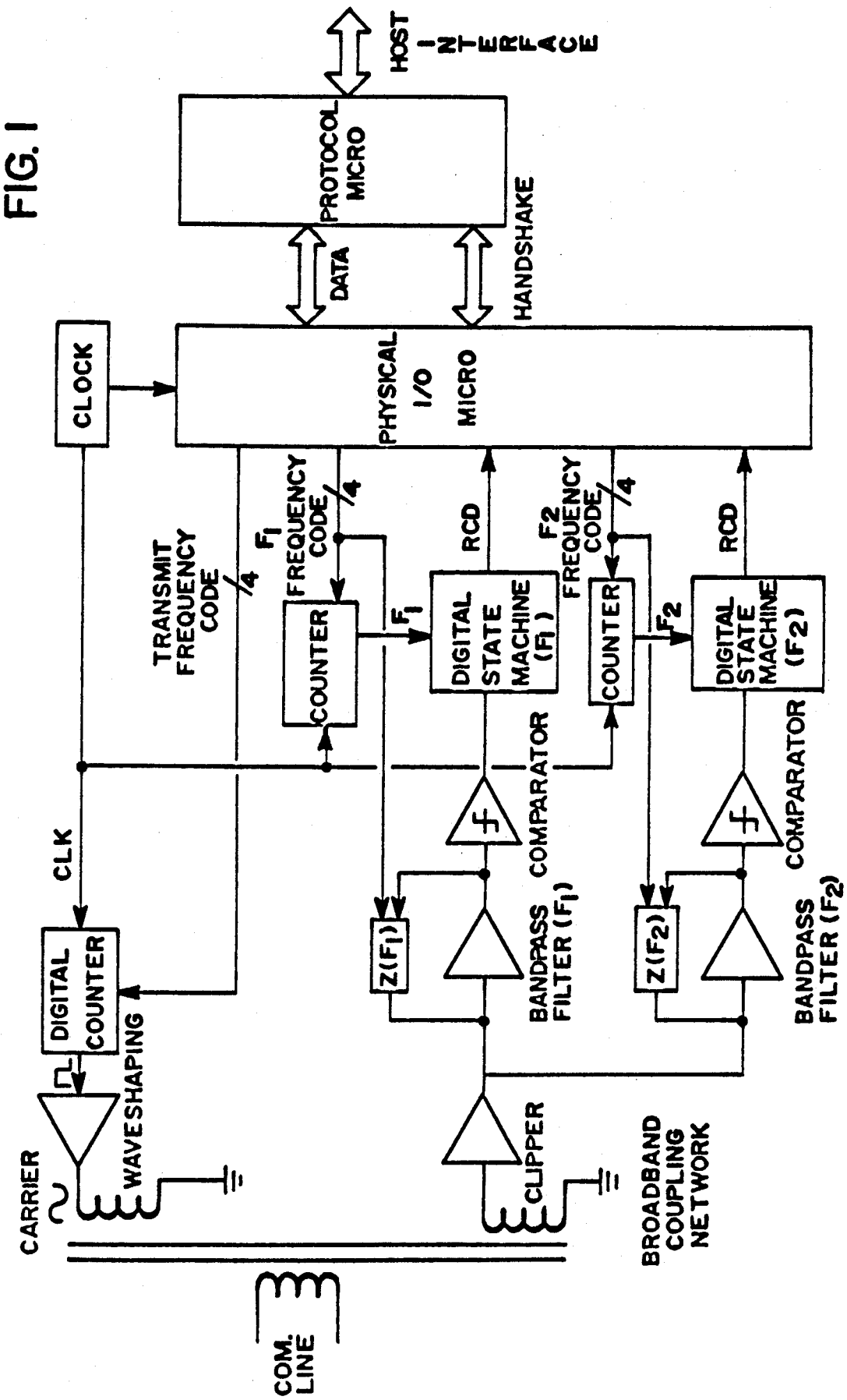
FIG. 1 is a schematic block circuit diagram of a system according to the invention.

An overall block diagram of a transceiver according to the invention is shown in FIG. 1. It consists of the following blocks:

A protocol microprocessor 10 implements network access, addressing, error control and recovery.

A physical I/O microprocessor 12 collects bit-level error statistics, determines operating frequencies, and controls transmit and receive hardware. Although shown as two separate functional blocks, these two microprocessors might be implemented in same hardware, i.e. the protocol and physical I/O programs could be time shared on the same computer.

An analog transmit section 14 generates carrier, gated by a coded bit stream coupling network 16, couples signal to transmission wire, and provides impulse protection.

An analog receive section 16 comprises a broad band front-end 18, clipper 20, narrow-band filters, 22, 24 tuned to one of 16 frequencies under control of the physical I/O micro 12 by switching in different resistors or superhet with transmit clock, followed by comparators, 26, 28.

Digital state machines, 30, 32 each have its detected frequency controlled by the physical I/O micro, so it correlates on the proper frequency.

PROTOCOL MICROPROCESSOR

Micro 10 supports a host interface, in the same way as in the above-identified patent. It implements the polling protocol disclosed therein or, as an alternative, may implement a cyclic time division protocol to provide multipoint communication and initiation of the communications link from any subscriber.

Figure 2:
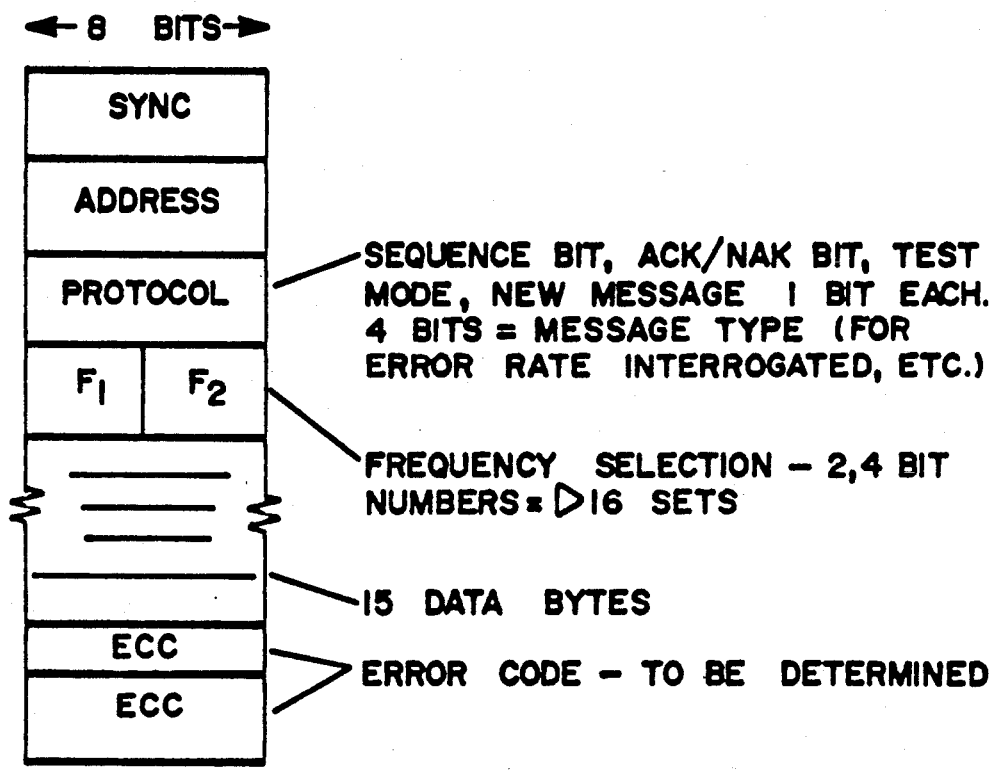
FIG. 2 is a diagram of a message block according to the invention.

In addition to the functions common to the present product, Micro 10 transmits information in each message showing the frequencies to be used in the next message block. A message block format is shown in FIG. 2.

PHYSICAL I/O MICRO

Figure 3:
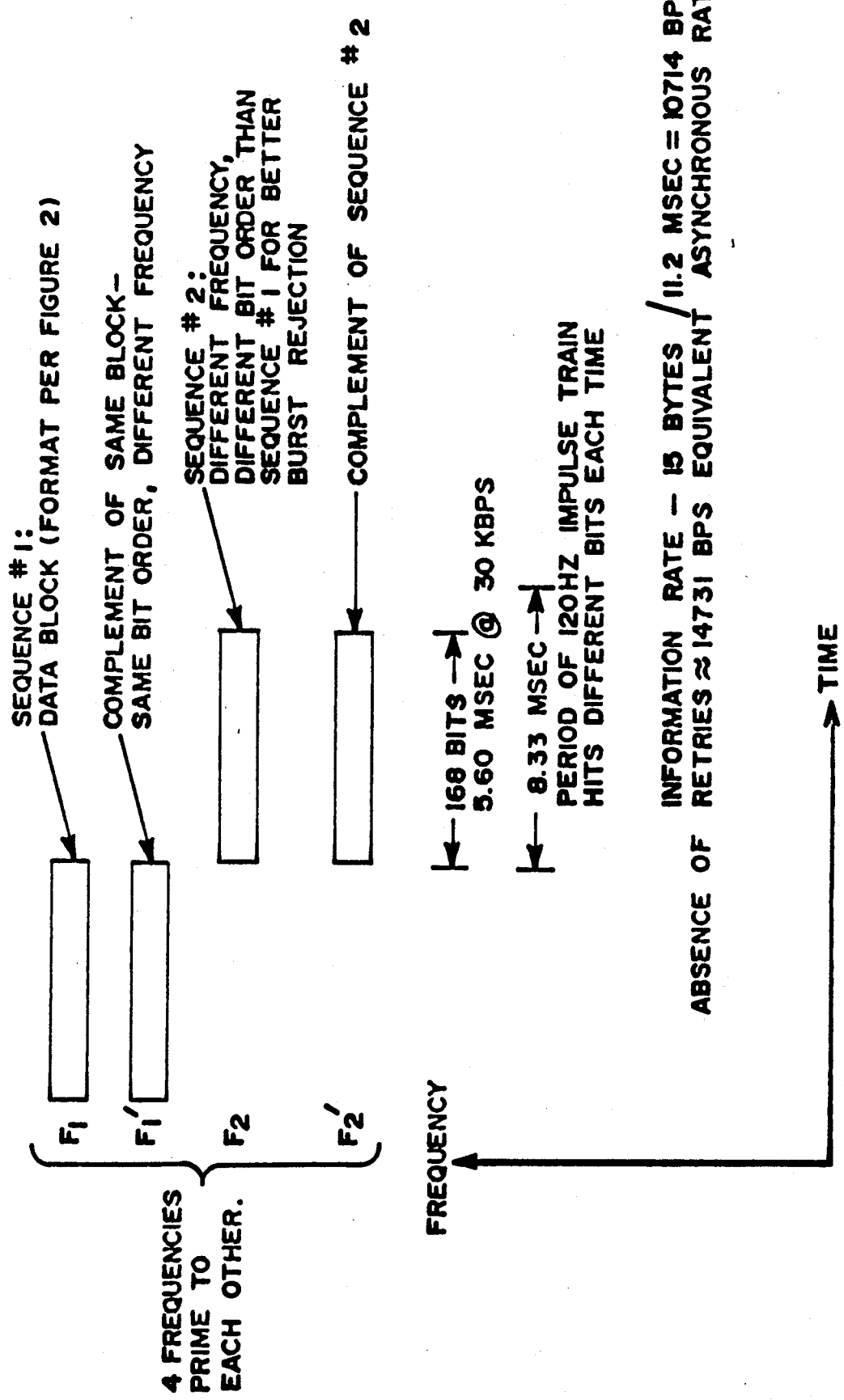
FIG. 3 is a diagram of frequency versus time illustrating the time diversity and spread spectrum techniques employed in the invention.

Micro 12 uses frequency and time diversity to spread the signal. This is illustrated in FIG. 3, and meets the time and data rate constraints one practical application. Two pairs of frequencies each of which forms an FSK (Frequency Shift Keying) pair, are transmitted one after the other.

However, each half of each FSK pair is treated as a separate signal, with error coding built in so that the entire message can be recovered in the absence of any of the other three frequencies. Because bit significance is inverted between the two members of the FSK pair, a particular noise situation which tends to destroy carrier acquisition (low frequency noise saturating the clipper) or noise which tends to cause false acquisition (in-band noise) will affect only one of the two bit streams. Bit order is scrambled to increase the effective gain of the error coding in the presence of burst errors. The message structure is chosen so that if an error occurs at any point in one of the two time diverse-pairs, its recurrence 1/120th of a second later will cause an error in a different set of bits, so the message can still be reconstructed. Adjacent bits in the first sequence are never adjacent in the second sequence.

If errors cannot be corrected on the fly, the system retries. The retries are asynchronous to 120 hz and a technique common in image-enhancement systems is used. The old block with uncorrectable errors is saved. If the next also has uncorrectable errors, it is overlaid with the last block, and, if the number of bits by which they differ is small, systematic combinations of the differing bits are tested through the coding algorithm, in order to build a complete message without having to get it all in the same retry.

Figure 4:
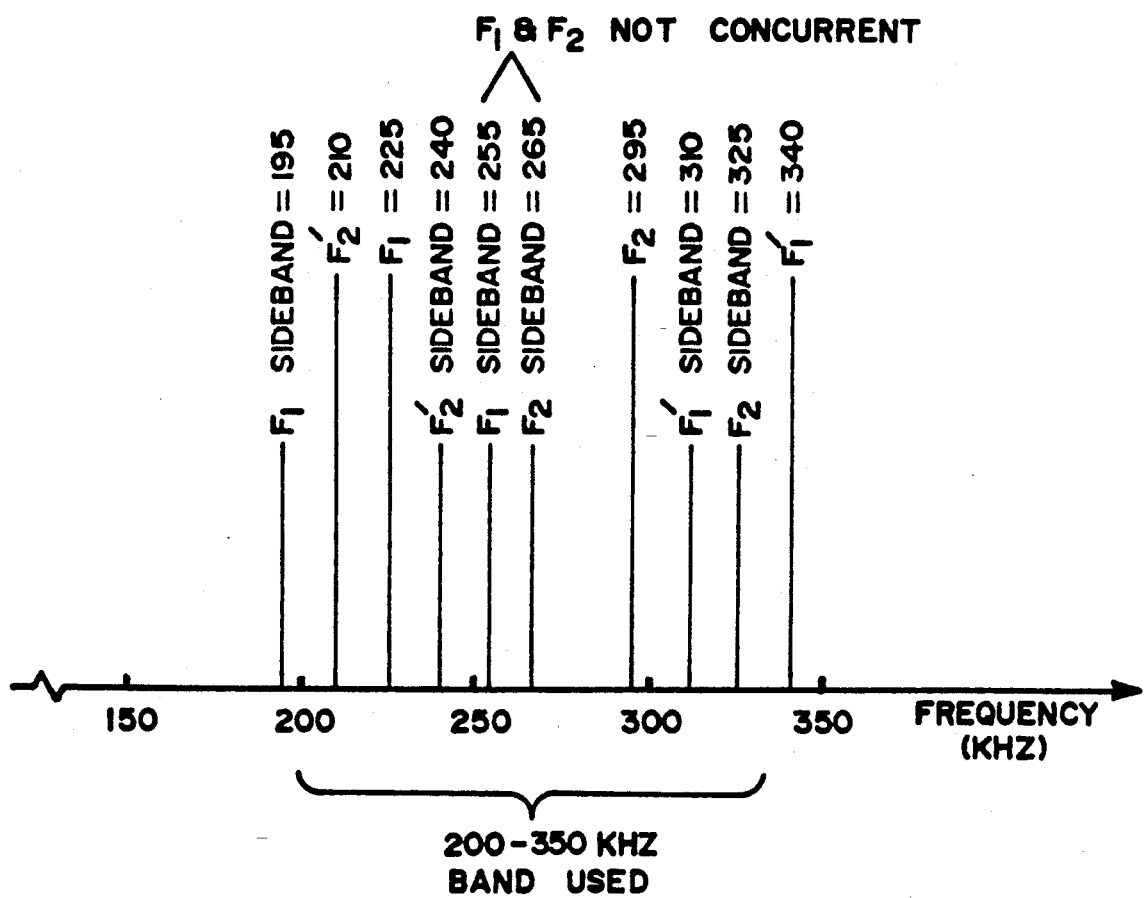
FIG. 4 is a diagram showing how a set of four frequencies may be chosen for orthogonality and no band overlap.

The four frequencies used are chosen from a set of 16 possible frequencies, so they are mutually orthogonal to one another to minimize the effects of multipath at any point affecting more than one. Since each individual frequency is on-off keyed, it will generate side bands offset by the bit rate from the carrier. The different frequencies are chosen so as not to interfere with the sidebands as well as the fundamental. A possible spectrum utilization for the bandwidth of 160 to 300 kHz, with a 30 KPBS data rate is illustrated in FIG. 4.

FREQUENCY ACQUISITION

The frequencies analoged are divided into 8 sets of 2 (F & F'). Therefore, only the codes for the frequencies of $F_1$ and $F_2$ for the next block to be transmitted are transmitted in the prior block as these also define $F_1'$ and $F_2'$.

To acquire the network when powered up, or after losing frequency sync, a slave transceiver listens to the 16 frequencies two at a time, stepping through the 8 available frequency sets at a rate of one change every 11.2 msec. (or two frames). This ultimately results in hearing a valid message, which will contain the correct frequency code to which the transceiver will then lock.

Choice of the particular frequencies to be used at any time is controlled by a master unit. In a cyclic Time Division, Multiple Access protocol, access-control and frequency control are treated independently; indeed a hot backup system can be included so that if the unit designated as the frequency control master goes off line, another designated unit detects this fact and takes over. The frequency control master collects data internally on the corrected error rates for messages received on the different channels, and, as grosser measure, on the retry rates. Special message formats are to be provided (see FIG. 3) so that the master can periodically interrogate other units and determine their received error rates for each frequency. These error rates are filtered (smoothed) to emphasize recent performance, the time constant being chosen based upon the expected time-rate-of-change of the noise Power Spectral Density function.

As long as the retry rates on all four channels in use remain zero after smoothing, no changes are made to the frequency selection. When the smoothed rates are nonzero, the worst frequency is altered. After a measurement period, it is altered again. The size and direction of the step is governed by the magnitude and sign of the performance change. This process continues until the size of the next step desired is below the quantization of frequency choices. If two or more frequencies are experiencing nonzero retry rates, then frequencies other than the worst are also adjusted, when searching by the "worst" frequency makes it better than the next-worst.

For guided vehicle applications, separate frequency sets may be maintained for each vehicle. Since each 168 bit packet is transmitted doubly-redundantly in ½ msec, about 89 adjustments per second will occur, which is more than adequate to move frequencies away from a dead spot in the wire as a vehicle traverses it. This results in each vehicle in the system working with its own set of frequencies. The memory cost—16 bits per vehicle, stored at the master, is modest.

ANALOG TRANSMIT SECTION

Referring to FIG. 1, each of the sixteen frequencies is represented by four bits of data output by the physical I/O processor. These bits are used to load a counter 34, which is clocked by clock 35 at some higher rate, in a manner analogous to the use of dip switches (in place of the four bits) to control UART clock rate in the above-identified patent.

Figure 5:
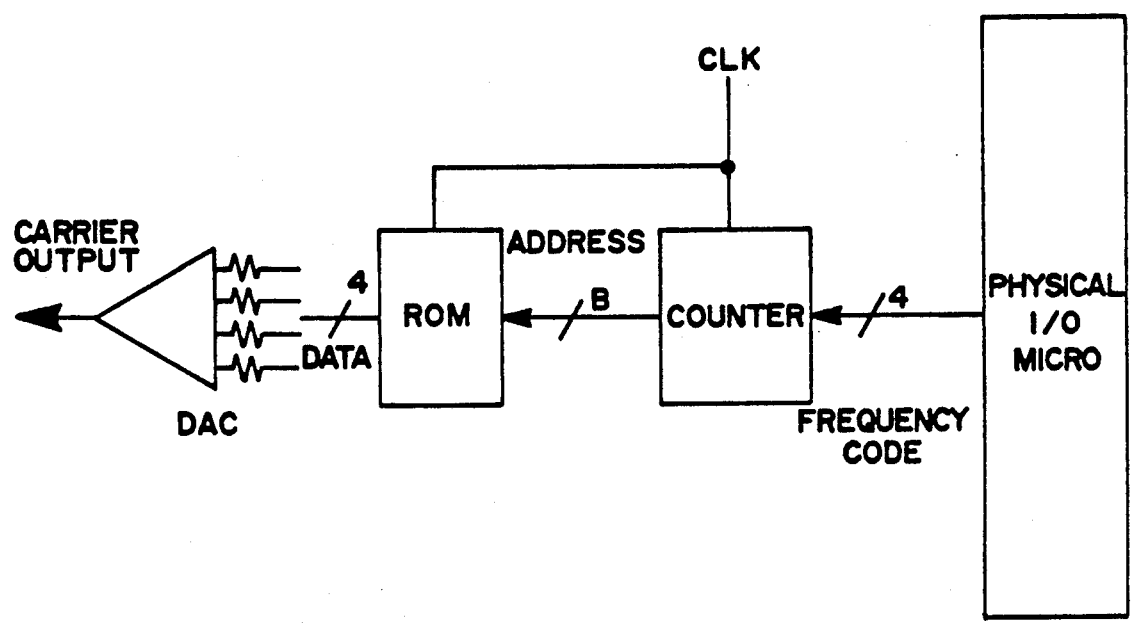
FIG. 5 is a schematic block circuit diagram of an alternative carrier synthesizer.

The resulting logic level square wave, at the desired carrier frequency, is fed to low pass filter 16 to round the edges. As long as the bandwidth employed is less than a factor of two, the harmonic content of the imperfect sine wave resulting does not produce significant clutter. If this is a problem, more expensive and complicated frequency synthesis may be employed, either in analog or by digital synthesis of a string of 4-bit values, through a PROM 36, which are then analog-to-digital converted in counter 38 and smoothed as in FIG. 5.

ANALOG FRONT-END AND RECEIVE SECTION

This is similar in structure to the patented system. It is necessary that the bandwidth of the coupling system be as broad as the full set of frequencies employed.

Figure 6:
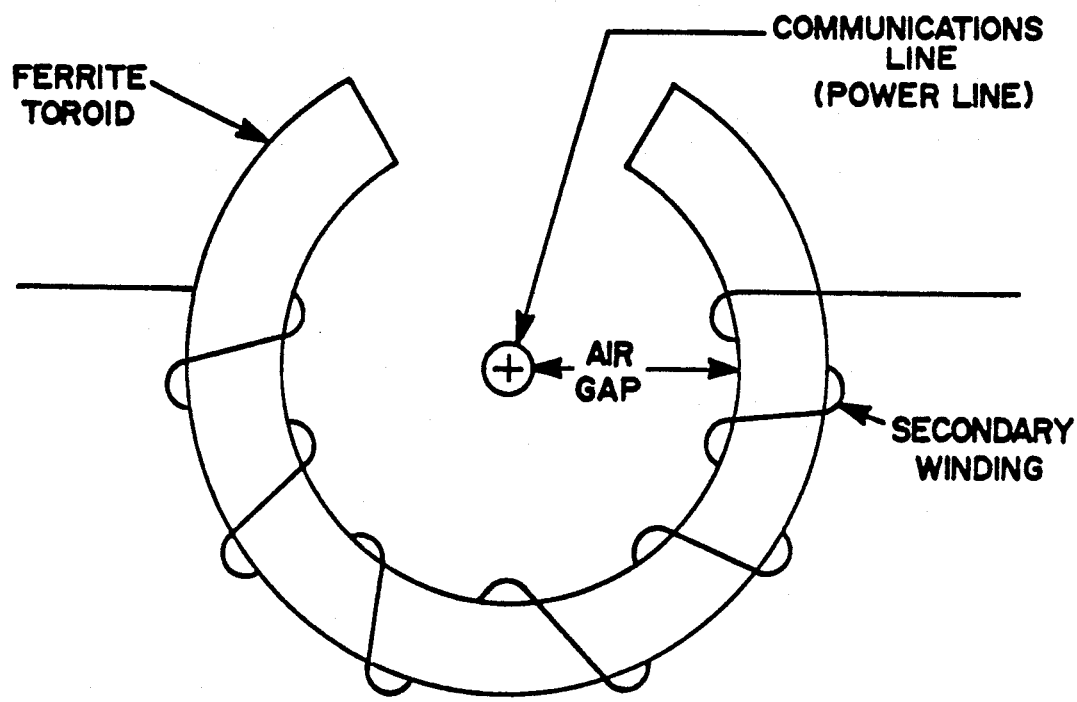
FIG. 6 is a diagram of a coupling antenna to an AC transmission line.

For power line applications, a ferrite antenna 40 may be curved rather than straight, largely enveloping the communicating conductor 42, as shown in FIG. 6. This approach reduces the cost of required protection circuitry as compared to a direct wired connection.

The analog filter section 16 must be controllable with respect to its center frequency. This is achieved by using the four bit frequency command to switch different RC values (time delays) into the feedback of the amplifier. Two such analog sections are provided, operating independently in parallel for the two frequencies active at any point in time.

Two state machine correlation detectors 30, 32 follow the analog filters 22, 24 and comparators 26, 28; they are similar in operation to, those in the above-identified patent, but have target frequency as an additional input from counters 27 and 29, respectively. They, therefore, track the two frequencies currently commanded by the micro 12, and output independent bit streams to it. (It may be efficient to embody these two state machines in a single chip or chip set; this does not affect their logical independence).

It will thus be seen that the objects set forth above, among those made apparent from the preceding description are efficiently attained and since certain changes may be made in the above systems and constructions without departing from the scope of the invention, it is intended that all matter contained in the above description or shown in the accompanying drawings shall be interpreted as illustrative and not in a limiting sense.

It is also understood that the following claims are intended to cover all of the generic and specific features of the invention herein described, and all statements of the scope of the invention which, as a matter of language, might be said to fall therebetween.

Having described my invention, what I claim as new and desire to secure by Letters Patent is:

1. A communications system comprising:

A. at least two transceivers for transmitting messages on at least one of a plurality of transceiver selected frequencies at least one at a time and for detecting data errors in said messages; and, B. control means for collecting error information on the data error rates being encountered on on each of said frequencies and for informing said transceivers of at least one frequency having the lowest current data error rate, said transceivers then transmitting messages on said at least one frequency having the lowest data error rate.

wherein said messages are binary coded and are transmitted on one frequency and the complement of said messages are transmitted simultaneously on another frequency; and wherein said messages are first transmitted on a first pair of frequencies, then retransmitted on a second pair of frequencies in a remapped bit order such that adjacent bits in when first transmitted are non-adjacent when retransmitted and identical bits are never spaced one onehundredtwentieth of a second apart when first transmitted and when retransmitted.

2. A communications system as defined in claim 1, wherein said control means for collecting error information is located at one of said transceivers.

3. A communications system as defined in claim 1, wherein each of said transceivers comprises means for collecting error information on the error rates in said messages received by it and each, except for one, transmits said error information to one of said transceivers comprising said control means for collecting error information, said one transceiver transmitting messages including information on the at least one frequency having the lowest data error rate.

4. A communications system as defined in any of claims 1 to 3, wherein said control means selects said at least one frequency by means of a hill-climbing optimization technique.

5. A communications system as defined in any of claims 1 through 3, wherein said pairs of frequencies are orthogonal.

6. A transceiver for transmitting binary coded messages on a pair of frequencies, each message during a first transmission being transmitted on a first frequency while its complement is being transmitted simultaneously on a second frequency; said transceivers retransmitting in a second transmission each message and its complement on a second apir of frequencies; and said message and its complement being remapped in said second transmission, such that adjacent bits in said first transmission are non-adjacent in said second transmission and the same bit is never transmitted at a rate of 1/120 of a second.

7. A transceiver as defined in claim 6, wherein said frequencies are orthogonal.

8. A communications system as defined in any of claims 1 through 3, 6, or 7 wherein said transceivers for receiving messages on a pair of frequencies simultaneously, comprise a pair of frequency controlled state machines each having a frequency controlled filter connected thereto and means for selecting the frequency of said state machine and the band-pass of the filter connected thereto in accordance with frequency information contained in the last message received.

9. A transceiver as defined in claim 8, wherein said frequencies are orthogonal.

10. A transceiver as defined in claim 9, wherein said filter comprises an operational amplifier and a feed back loop having a time delay selected by said means for selecting.

11. A transceiver as defined in claim 8, wherein said filter comprises an operational amplifier and a feed back loop having a time delay selected by said means for selecting.

* * * * *